United States Patent
Nakamura et al.

(10) Patent No.: US 11,715,796 B2
(45) Date of Patent: Aug. 1, 2023

(54) HIGH FREQUENCY TRANSISTOR

(71) Applicants: Kabushiki Kaisha Toshiba, Tokyo (JP); Toshiba Electronic Devices & Storage Corporation, Tokyo (JP)

(72) Inventors: Mitsutoshi Nakamura, Kanagawa (JP); Kazuya Nishihori, Tokyo (JP); Keita Masuda, Kanagawa (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 123 days.

(21) Appl. No.: 17/472,495

(22) Filed: Sep. 10, 2021

(65) Prior Publication Data
US 2022/0293791 A1 Sep. 15, 2022

(30) Foreign Application Priority Data

Mar. 12, 2021 (JP) .................. 2021-039941

(51) Int. Cl.
*H01L 29/45* (2006.01)
*H01L 29/78* (2006.01)
(Continued)

(52) U.S. Cl.
CPC .......... *H01L 29/7836* (2013.01); *H01L 23/66* (2013.01); *H01L 29/0649* (2013.01); *H01L 29/45* (2013.01)

(58) Field of Classification Search
None
See application file for complete search history.

(56) References Cited

U.S. PATENT DOCUMENTS 5,587,604 A 12/1996 Machesney et al.
6,060,750 A 5/2000 Hisamoto et al.
(Continued)

FOREIGN PATENT DOCUMENTS

CN 102456628 A * 5/2012 ....... H01L 21/26586
JP H05-235345 9/1993
(Continued)

OTHER PUBLICATIONS

Jain et al., "Comparison of Heat Outflow in Dense Sub-14nm Contemporary NFETs: Bulk/SOI, Inserted-Oxide FinFET and Nanowire FET", Downloaded on May 26, 2020 from IEEE Xplore.
(Continued)

*Primary Examiner* — Michael Lebentritt
(74) *Attorney, Agent, or Firm* — Knobbe, Martens, Olson & Bear, LLP

(57) ABSTRACT

A high frequency transistor includes a first semiconductor layer, a first insulating film and a control electrode. The first semiconductor layer on the first insulating film extends in a first direction along an upper surface of the first insulating film. The first semiconductor layer has a first layer thickness in a second direction perpendicular to the upper surface, and a first width in a third direction orthogonal to the first direction. The first width is greater than the first layer thickness. The control electrode covers upper and side surfaces of the first semiconductor layer. The first semiconductor layer includes a first region of a first conductivity type, second and third regions of a second conductivity type. The first to third regions are arranged in the first direction. The first region is provided between the second and third region. The control electrode covers the first region.

15 Claims, 9 Drawing Sheets

(51) Int. Cl.
*H01L 29/06* (2006.01)
*H01L 23/66* (2006.01)

(56) References Cited

U.S. PATENT DOCUMENTS

| | | | |
|---|---|---|---|
| 7,358,121 B2 | 4/2008 | Chau et al. | |
| 9,048,120 B2 | 6/2015 | Suk et al. | |
| 9,472,512 B1 * | 10/2016 | Toh | H01L 23/647 |
| 10,347,655 B2 | 7/2019 | Nishihori et al. | |
| 2003/0113970 A1 | 6/2003 | Fried et al. | |
| 2004/0201063 A1 | 10/2004 | Fukuda | |
| 2005/0127362 A1 | 6/2005 | Zhang et al. | |
| 2006/0202268 A1 | 9/2006 | Chiba | |
| 2007/0023756 A1 | 2/2007 | Anderson et al. | |
| 2008/0116514 A1 | 5/2008 | Zhu et al. | |
| 2011/0031552 A1 | 2/2011 | Iwamatsu et al. | |
| 2013/0249003 A1 | 9/2013 | Oh et al. | |
| 2014/0159116 A1 | 6/2014 | Basker et al. | |
| 2015/0064889 A1 | 3/2015 | Paraschiv et al. | |
| 2016/0148936 A1 | 5/2016 | Xu et al. | |
| 2017/0213848 A1 | 7/2017 | Nishihori et al. | |

FOREIGN PATENT DOCUMENTS

| | | | |
|---|---|---|---|
| JP | H06-85262 | | 3/1994 |
| JP | H07-302908 | | 11/1995 |
| JP | H08-111530 | | 4/1996 |
| JP | H09-260666 | | 10/1997 |
| JP | H11-233785 | | 8/1998 |
| JP | H10-242477 | A | 9/1998 |
| JP | H11-135795 | | 5/1999 |
| JP | 2002-094067 | A | 3/2002 |
| JP | 2003-174172 | A | 6/2003 |
| JP | 2003-197919 | A | 7/2003 |
| JP | 2003-204068 | A | 7/2003 |
| JP | 2004273983 | A * | 9/2004 ........ H01L 21/28114 |
| JP | 2004-311903 | A | 11/2004 |
| JP | 2005-038959 | A | 2/2005 |
| JP | 2005-150402 | A | 6/2005 |
| JP | 2005-175481 | A | 6/2005 |
| JP | 2006-156862 | A | 6/2006 |
| JP | 2007-324530 | A | 12/2007 |
| JP | 2008-131038 | A | 5/2008 |
| JP | 2009-500868 | A | 1/2009 |
| JP | 2009-512996 | A | 3/2009 |
| JP | 2009-182360 | A | 8/2009 |
| JP | 2011-040458 | A | 2/2011 |
| JP | 2013-138211 | A | 7/2013 |
| JP | 2014-107569 | A | 6/2014 |
| JP | 2014-239233 | A | 12/2014 |
| JP | 2015-065412 | A | 4/2015 |
| JP | 2015-536581 | A | 12/2015 |
| JP | 2017-011291 | A | 1/2017 |
| JP | 2017-130625 | A | 7/2017 |
| JP | 6161350 | B2 | 7/2017 |
| JP | 2017-535958 | A | 11/2017 |
| JP | 6385965 | B2 | 9/2018 |
| WO | WO 2007/008934 | A1 | 1/2007 |
| WO | WO 2012/054642 | A1 | 4/2012 |

OTHER PUBLICATIONS

Poljak, "Technological constrains of bulk FinFET structure in comparison with SOI FinFET", ISDRS 2007, Dec. 12-14, 2008, College Park, MD, USA.

* cited by examiner

HIGH FREQUENCY TRANSISTOR

CROSS-REFERENCE TO RELATED APPLICATIONS

This application is based upon and claims the benefit of priority from Japanese Patent Application No. 2021-039941, filed on Mar. 12, 2021; the entire contents of which are incorporated herein by reference.

FIELD

Embodiments relate to a high frequency transistor.

BACKGROUND

A high frequency transistor is used in an antenna control circuit of a mobile telephone or the like. The high frequency transistor includes, for example, a planar gate MOSFET structure that has an SOI (Silicon on Insulator) structure to achieve high-speed switching characteristics. There is, however, room for improvement in the characteristics of such a high frequency transistor.

DETAILED DESCRIPTION

Figure 1A:
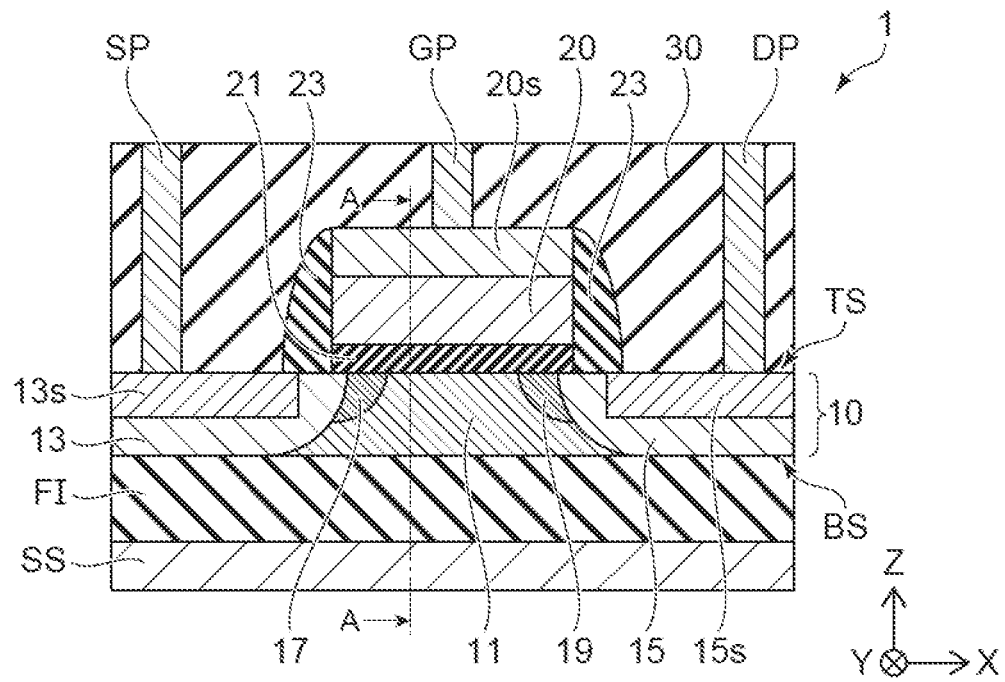
FIGS. 1A and 1B are schematic cross-sectional views showing a high frequency transistor according to a first embodiment.

According to an embodiment, a high frequency transistor includes a first semiconductor layer, a first insulating film, a control electrode and a second insulating film. The first semiconductor layer is provided on the first insulating film and extends in a first direction along an upper surface of the first insulating film. The first semiconductor layer has a first layer thickness in a second direction perpendicular to the upper surface of the first insulating film, and a first width in a third direction orthogonal to the first direction. The third direction is directed along the upper surface of the first insulating film. The first width is greater than the first layer thickness. The control electrode is partially provided on the first semiconductor layer. The control electrode covers upper and side surfaces of the first semiconductor layer, the upper surface crossing the second direction, the side surface crossing the third direction. The second insulating film is provided between the first semiconductor layer and the control electrode. The second insulating film electrically insulates the control electrode from the first semiconductor layer. The first semiconductor layer includes a first region of a first conductivity type, a second region of a second conductivity type, and a third region of the second conductivity type. The first region, the second region, and the third region are arranged in the first direction. The first region is provided between the second region and the third region. The control electrode covering the first region.

Embodiments will now be described with reference to the drawings. The same portions inside the drawings are marked with the same numerals; a detailed description is omitted as appropriate; and the different portions are described. The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

There are cases where the dispositions of the components are described using the directions of XYZ axes shown in the drawings. The X-axis, the Y-axis, and the Z-axis are orthogonal to each other. Hereinbelow, the directions of the X-axis, the Y-axis, and the Z-axis are described as an X-direction, a Y-direction, and a Z-direction. Also, there are cases where the Z-direction is described as upward and the direction opposite to the Z-direction is described as downward.

First Embodiment

Figure 1B:
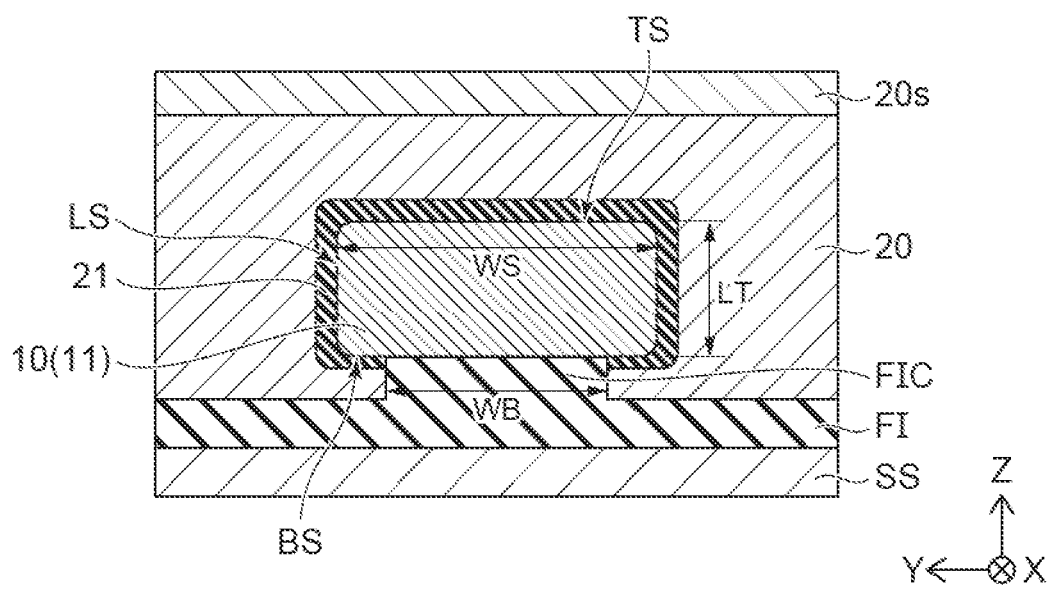

FIGS. 1A and 1B are schematic cross-sectional views showing a high frequency transistor 1 according to a first embodiment. FIG. 1B is a cross-sectional view along line A-A shown in FIG. 1A.

The high frequency transistor 1 includes, for example, a semiconductor substrate SS, a first insulating film 9, a semiconductor layer 10, and a control electrode 20.

The semiconductor substrate SS is, for example, a silicon substrate. The first insulating film FI is, for example, a silicon oxide film. The semiconductor layer 10 includes, for example, silicon. The control electrode 20 is, for example, a gate electrode. The control electrode 20 includes, for example, conductive polysilicon.

The first insulating film FI is provided on the semiconductor substrate SS. The semiconductor layer 10 is provided on the first insulating film FI. The semiconductor layer 10 extends, for example, in an X-direction along the upper surface of the first insulating film FI (referring to FIG. 2A). The high frequency transistor 1 has an SOI structure.

As shown in FIG. 1A, the control electrode 20 is partially provided on the semiconductor layer 10. A second insulating film 21 is provided between the semiconductor layer 10 and the control electrode 20. The second insulating film 21 electrically insulates the control electrode 20 from the semiconductor layer 10. The second insulating film 21 is, for example, a gate insulating film. The second insulating film 21 is, for example, a silicon oxide film.

The semiconductor layer 10 includes a first region 11 of a first conductivity type, a second region 13 of a second conductivity type, and a third region 15 of the second conductivity type. The first conductivity type is described as a p-type and the second conductivity type is described as an n-type hereinbelow, but the configuration is not limited thereto.

The first region 11, the second region 13, and the third region 15 are arranged in a first direction, e.g., the X-direction that is directed along an upper surface TS of the semiconductor layer 10. The first region 11 is provided between the second region 13 and the third region 15. The first region 11 is provided between the first insulating film FI and the control electrode 20. The first region 11 is, for example, a channel region. The second region 13 is, for example, a source region. The third region 15 is, for example, a drain region.

The semiconductor layer 10 further includes a first contact region 13s, a second contact region 15s, a first extension region 17 of the second conductivity type, and a second extension region 19 of the second conductivity type. The first contact region 13s and the second contact region 15s are, for example, silicide regions that include nickel (Ni), cobalt, platinum (Pt), etc.

The first contact region 13s is provided on the second region 13. The second region 13 includes a portion that is positioned between the first region 11 and the first contact region 13s. In other words, the first contact region 13s is apart from the first region 11.

The second contact region 15s is provided on the third region 15. The third region 15 includes a portion that is positioned between the first region 11 and the second contact region 15s. In other words, the second contact region 15s is apart from the first region 11.

The first extension region 17 extends, for example, from the second region 13 into the first region 11 along the interface between the semiconductor layer 10 and the second insulating film 21. The first extension region 17 includes a second-conductivity-type impurity with a lower concentration than a concentration of the second-conductivity-type impurity in the second region 13.

The second extension region 19 extends, for example, from the third region 15 into the first region 11 along the interface between the semiconductor layer 10 and the second insulating film 21. The second extension region 19 includes the second-conductivity-type impurity with a lower concentration than a concentration of the second-conductivity-type impurity in the third region 15.

The first extension region 17 and the second extension region 19 each are provided between the first insulating film FI and the control electrode 20. The first region 11 includes a portion that is positioned between the first extension region 17 and the second extension region 19. The portion of the first region 11 faces the control electrode 20 via the second insulating film 21.

The high frequency transistor 1 further includes sidewalls 23, a third insulating film 30, and contact plugs SP, DP, and GP. The sidewall 23 is, for example, an insulating film such as a silicon oxide film, a nitride film, or the like, or a stacked film of such insulating films. The third insulating film 30 includes, for example, a silicon oxide film or a silicon nitride film. The contact plugs SP, DP, and GP include, for example, tungsten (W).

The control electrode 20 includes, for example, a lower surface that contacts the second insulating film 21, an upper surface at the side opposite to the lower surface, and a side surface that is linked to the upper surface and the lower surface. The control electrode 20 also includes a contact region 20s that is provided at the upper surface side. The contact region 20s is, for example, a silicide region that includes nickel (Ni), cobalt (Co), platinum (Pt), etc.

The sidewalls 23 are provided on the side surfaces of the control electrode 20. The sidewalls 23 are provided on the side surfaces that cross the direction, e.g., the X-direction that is directed from the second region 13 toward the third region 15 of the semiconductor layer 10.

The second region 13 includes a portion that is positioned between the first insulating film FI and the sidewall 23 and between the first contact region 13s and the first extension region 17. The third region 15 also includes a portion that is positioned between the first insulating film FI and the other sidewall 23 and between the second contact region 15s and the second extension region 19.

The third insulating film 30 covers the control electrode 20 and the upper surface TS of the semiconductor layer 10. The sidewall 23 is positioned between the control electrode 20 and the third insulating film 30.

The contact plugs SP, DP, and GP extend through the third insulating film 30. The contact plugs SP, DP, and GP extend in a second direction, e.g., a Z-direction that is directed from the first insulating film FI toward the control electrode 20.

The contact plug SP is connected to the first contact region 13s. The contact plug SP is electrically connected to the second region 13 via the first contact region 13s.

The contact plug DP is connected to the second contact region 15s. The contact plug DP is electrically connected to the third region 15 via the second contact region 15s.

The contact plug GP is connected to the contact region 20s. The contact plug GP is electrically connected to the control electrode 20 via the contact region 20s.

The contact plugs SP, GP, and DP are not limited to the configurations described above. For example, the contact plugs SP, GP, and DP each may be subdivided into multiple portions. The contact plug GP may be connected to the contact region 20s of the control electrode 20 that is provided outside the active region of the high frequency transistor 1.

As shown in FIG. 13, the semiconductor layer 10 has, for example, a rectangular shape at a cross section along the Y-Z plane. The semiconductor layer 10 includes the upper surface TS, a lower surface BS, and a side surface LS. It should be noted that the rectangular cross-section of the semiconductor layer 10 may include four corners that are rounded or chamfered.

The control electrode 20 covers the upper surface TS and the side surface LS of the semiconductor layer 10 via the second insulating film 21. The control electrode 20 includes a portion that extends between the first insulating film FI and the semiconductor layer 10. The portion of the control electrode 20 faces a portion of the lower surface BS of the semiconductor layer 10 via the second insulating film 21.

The first insulating film FI includes, for example, a contact portion FIC that contacts the lower surface BS of the semiconductor layer 10. The contact portion FIC is a protrusion that contacts the lower surface BS of the semiconductor layer 10. The contact portion FIC has a width WB that is less than a width WS of the semiconductor layer 10 in a third direction, e.g., a Y-direction. The third direction is orthogonal to the extension direction of the semiconductor layer 10 (the X-direction). The contact portion FIC contacts the third-direction center of the semiconductor layer 10.

The width WS in the Y-direction of the semiconductor layer 10 is greater than a layer thickness LT in the Z-direction of the semiconductor layer 10. Thereby, compared to a planar gate MOSFET, for example, the source-drain current capacity becomes larger in the high frequency transistor 1.

Figure 2A:
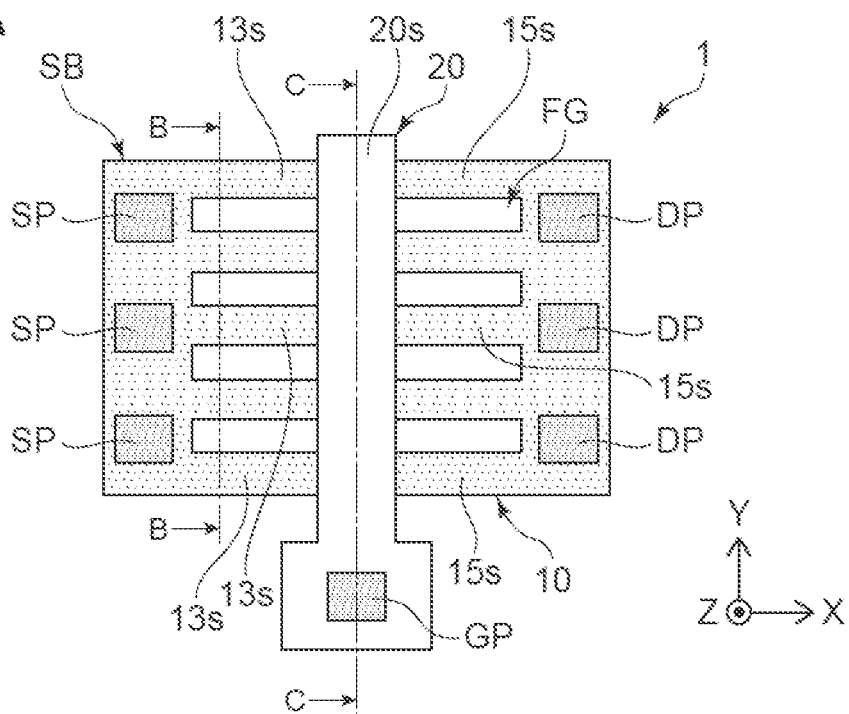
FIGS. 2A to 2C are schematic views showing the high frequency transistor according to the first embodiment.
Figure 2B:
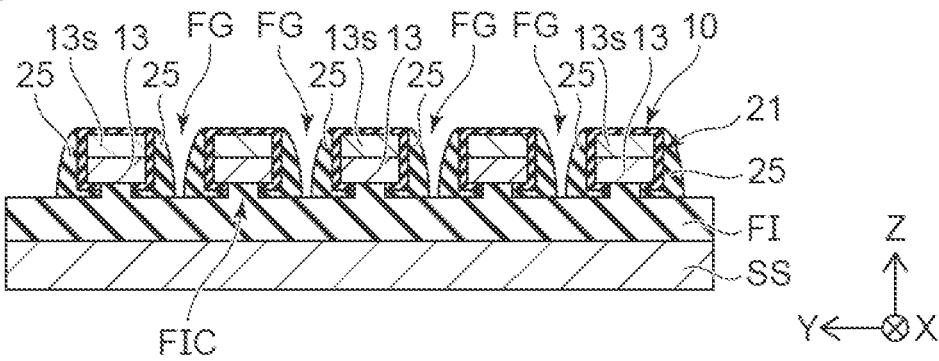
Figure 2C:
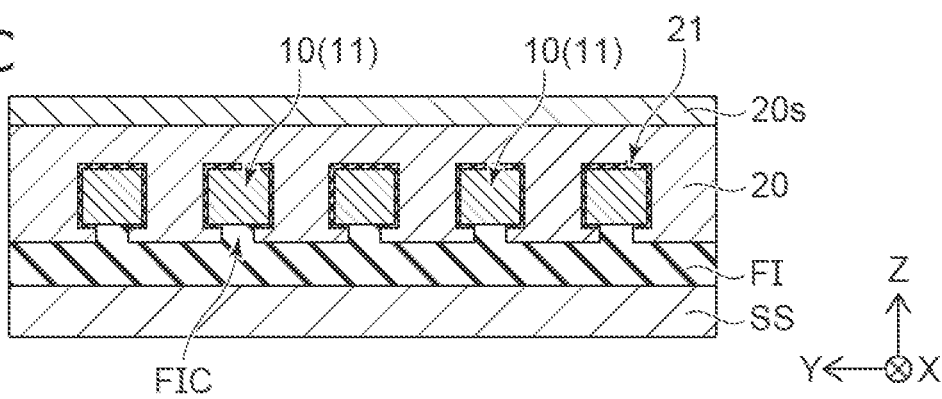

FIGS. 2A to 2C are schematic views showing the high frequency transistor 1 according to the first embodiment.

FIG. 2A is a plan view showing the high frequency transistor 1. FIG. 2B is a cross-sectional view along line B-B shown in FIG. 2A. FIG. 2C is a cross-sectional view along line C-C shown in FIG. 2A.

As shown in FIG. 2A, the high frequency transistor 1 includes, for example, a semiconductor part SB that is provided on the first insulating film FI The semiconductor part SB includes, for example, multiple semiconductor layers 10 that are subdivided by multiple trenches FG extending in the X-direction.

The multiple semiconductor layers 10 are arranged in the Y-direction. The control electrode 20 extends in the Y-direction and straddles the multiple semiconductor layers 10. The multiple semiconductor layers 10 are formed to be joined together at the two X-direction ends. The multiple semiconductor layers 10 are electrically connected to the contact plugs SP and DP.

As shown in FIG. 2B, the multiple semiconductor layers 10 are arranged in the Y-direction along the upper surface of the first insulating film FI Sidewalls 25 are provided on both side surfaces of each semiconductor layer 10 inside the trenches FG. The sidewalls 25 are formed simultaneously with the sidewall 23 shown in FIG. 1A and includes, for example, an insulating film such as a silicon oxide film, a nitride film, or the like, or a stacked film of such insulating films. Alternatively, the high frequency transistor 1 may have a structure without the sidewall 25.

The first insulating film FI contacts the lower surface BS of the semiconductor layer 10 via the contact portion FIC (referring to FIG. 1B). The sidewall 25 includes a portion that extends between the first insulating film FI and the lower surface BS of the semiconductor layer 10. The second insulating film 21 is provided between the semiconductor layer 10 and the sidewall 25.

As shown in FIG. 2C, the control electrode 20 fills the trenches FG. In other words, the control electrode 20 extends between two semiconductor layers 10 adjacent to each other in the Y-direction. The control electrode 20 faces the side surfaces of the two adjacent semiconductor layers 10 via the second insulating films 21. The control electrode 20 also extends between the first insulating film FI and the semiconductor layer 10. The control electrode 20 faces a portion of the lower surface BS of the semiconductor layer 10 via the second insulating film 21. In other words, in a cross section parallel to the Y-Z plane, the control electrode 20 covers four corners of the rectangular cross-section of the semiconductor layer 10 via the second insulating film 21.

Figure 3A:
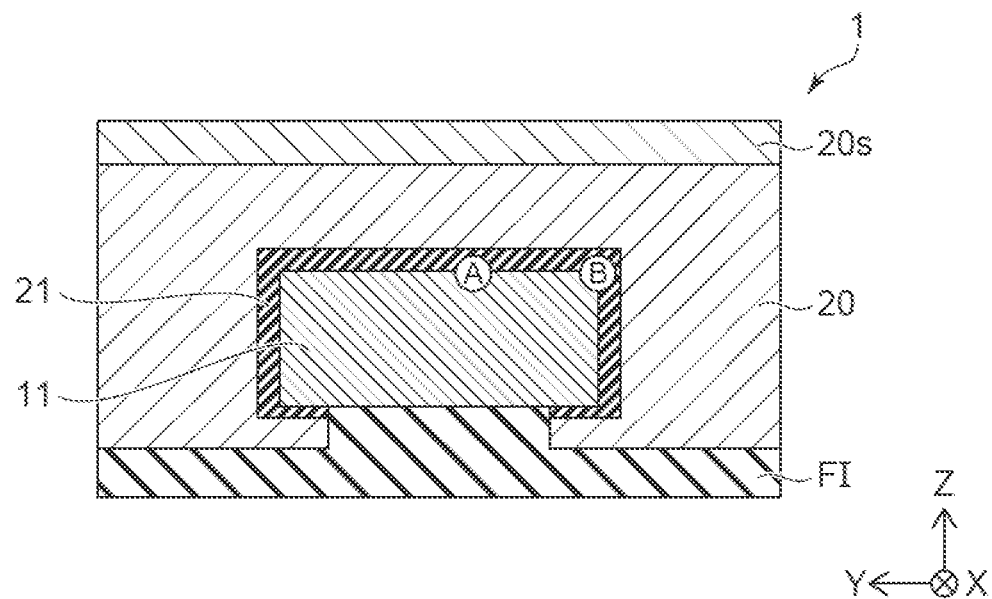
FIGS. 3A and 3B are schematic views showing characteristics of the high frequency transistor according to the first embodiment.
Figure 3B:
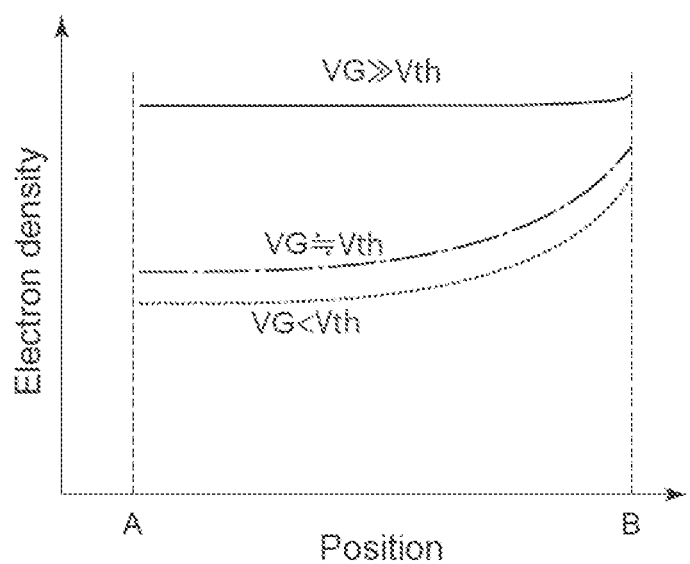

FIGS. 3A and 3B are schematic views showing characteristics of the high frequency transistor 1 according to the first embodiment. FIG. 3A is a cross-sectional view corresponding to the cross section shown in FIG. 1B. FIG. 3B is a graph showing the electron density in the first region 11 of the semiconductor layer 10. In FIG. 3B, the electron density in the vicinity of the second insulating film 21 is shown along the interface between the second insulating film 21 and the first region 11.

FIG. 3B illustrates the electron density distribution between point A and point B shown in FIG. 3A. The horizontal axis is the position between point A and point B; and the vertical axis is the electron density. In FIG. 3B, shown are the electron density distributions which depend on a gate voltage VG applied to the control electrode 20.

The electron density increases toward the corner of the first region 11 (point B) when the gate voltage VG is less than a threshold voltage Vth or when the gate voltage VG is substantially equal to the threshold voltage Vth. On the other hand, when the gate voltage VG is greater than the threshold voltage Vth, the electron density distribution between point A and point. B is substantially uniform.

Figure 4A:
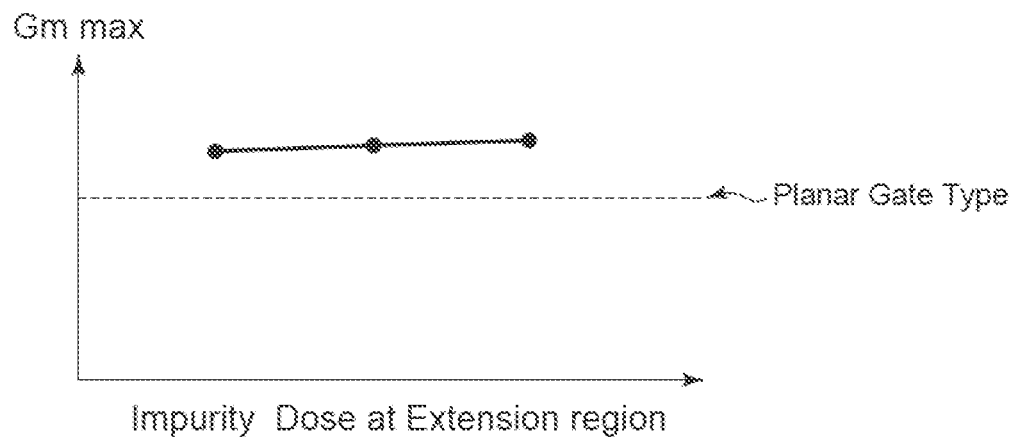
FIGS. 4A and 4B are graphs showing other characteristics of the high frequency transistor according to the first embodiment.
Figure 4B:
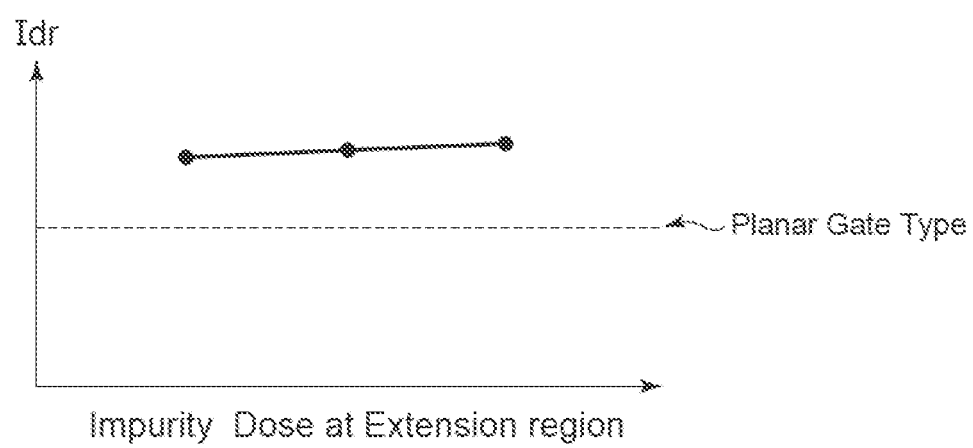

FIGS. 4A and 4B are graphs showing other characteristics of the high frequency transistor 1 according to the first embodiment. FIG. 4A is a graph showing a maximum value Gmmax of a transconductance Gm. FIG. 4B is a graph illustrating a drain reverse current Idr.

In FIGS. 4A and 4B, the horizontal axis is the dose of the second-conductivity-type impurity at the extension regions ("Extension region") 17 and 19. The characteristics of a MOSFET that has a planar gate structure (see FIGS. 5A and 5B) are shown by broken lines in the drawings.

As shown in FIG. 4A, Gmmax of the high frequency transistor 1 is greater than Gmmax of the MOSFET having the planar gate structure. As shown in FIG. 4B, Idr of the high frequency transistor 1 is greater than Idr of the MOSFET having the planar gate structure. In the high frequency transistor 1 according to the embodiment, Gmmax and Idr can be increased by covering the four corners of the semiconductor layer 10 with the control electrode 20.

Second Embodiment

Figure 5A:
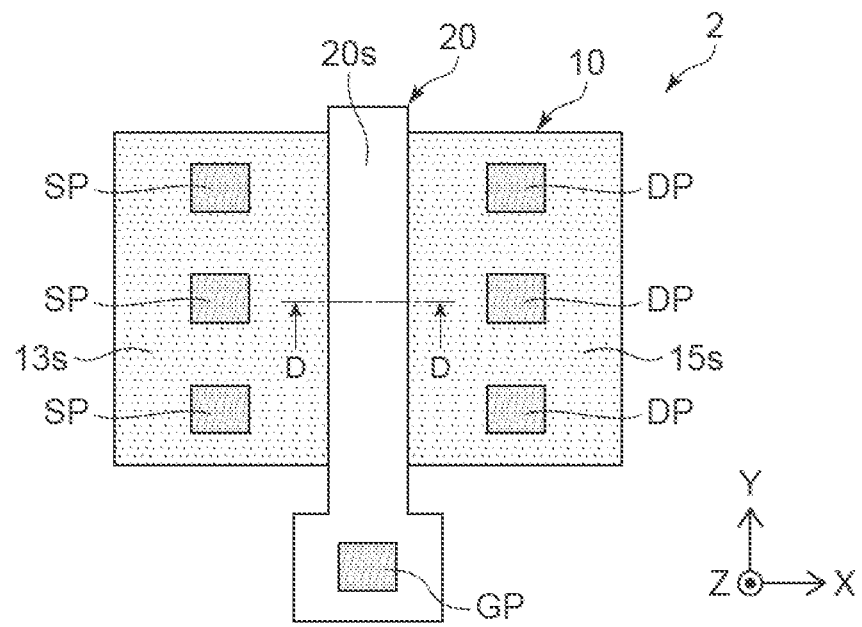
FIGS. 5A and 5B are schematic cross-sectional views showing a high frequency transistor according to a second embodiment.
Figure 5B:
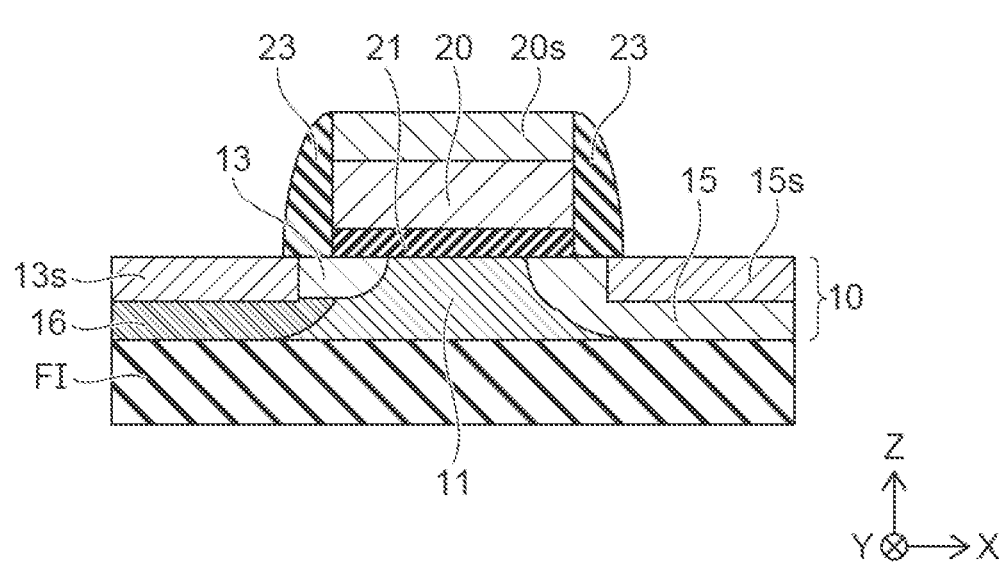

FIGS. 5A and 5B are schematic views showing a high frequency transistor 2 according to a second embodiment. FIG. 5A is a plan view. FIG. 5B is a cross-sectional view along line D-D shown in FIG. 5A.

As shown in FIG. 5A, the high frequency transistor 2 includes the semiconductor layer 10 and the control electrode 20. The control electrode 20 is provided on the semiconductor layer 10 and extends, for example, in the Y-direction. When viewed in top-view, the control electrode 20 divides the semiconductor layer 10 into, for example, the source side and the drain side. The contact plug SP is electrically connected to the contact region 13s at the source side. The contact plug DP is electrically connected to the contact region 15s at the drain side.

As shown in FIG. 5B, the high frequency transistor 2 further includes the first insulating film FI, the second insulating film 21, and the sidewall 23. The third insulating film 30 (referring to FIG. 1A) is not illustrated in FIG. 5B.

The first insulating film FI is provided, for example, on the semiconductor substrate SS (referring to FIGS. 1A and 1B). The semiconductor layer 10 is provided on the first insulating film FI. The second insulating film 21 is provided between the semiconductor layer 10 and the control electrode 20. The second insulating film 21 electrically insulates the semiconductor layer 10 from the control electrode 20. The sidewall 23 is provided on the side surface of the control electrode 20.

The semiconductor layer 10 includes the first region 11, the second region 13, the third region 15, a fourth region 16, the first contact region 13s, and the second contact region 15s.

The first region 11 is, for example, a channel region of the first conductivity type. The first region 11 is provided between the first insulating film FI and the control electrode 20.

The second region 13 is, for example, a source region of the second conductivity type. The third region 15 is, for example, a drain region of the second conductivity type. The first region 11 is provided between the second region 13 and the third region 15. The first region 11 includes a portion that is positioned between the second region 13 and the third region 15 and faces the control electrode 20 via the second insulating film 21.

In the example, the first contact region 13s and the second region 13 are arranged along the front surface of the semiconductor layer 10. The second region 13 is provided between the first region 11 and the first contact region 13s. Also, for example, the second region 13 is provided between the first insulating film FI and the sidewall 23 (the source side). The first contact region 13s is in contact with the second region 13 and electrically connected thereto.

The fourth region 16 is, for example, a body contact ("Body contact") region of the first conductivity type. The fourth region 16 is provided between the first insulating film FI and the first contact region 13s. The fourth region 16 is linked to the first region 11. The fourth region 16 is electrically connected to the first region 11 between the first insulating film FI and the second region 13. The fourth region 16 also is linked to the first contact region 13s and electrically connected thereto. In other words, the first region 11 is electrically connected to the first contact region 13s via the fourth region 16.

Figure 6:
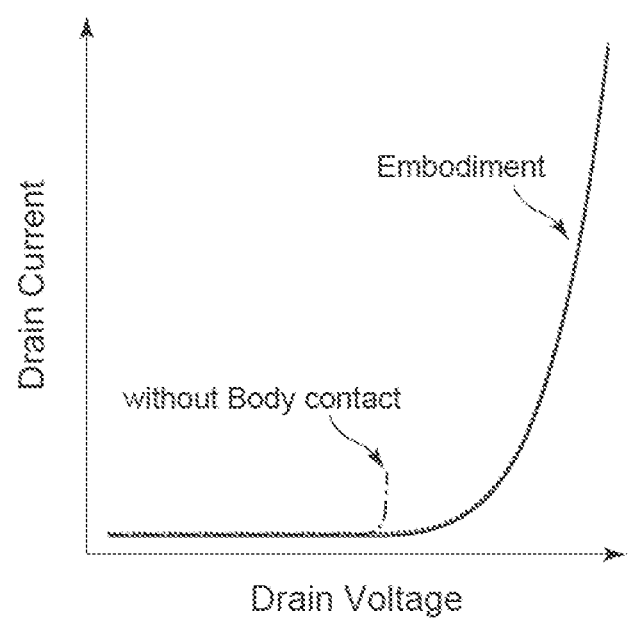
FIG. 6 is a graph showing characteristics of the high frequency transistor according to the second embodiment.

FIG. 6 is a graph showing characteristics of the high frequency transistor 2 according to the second embodiment. The horizontal axis is the drain voltage; and the vertical axis is the drain current at turn-off.

In the example, a characteristic of the high frequency transistor 2 ("Embodiment") and a characteristic of a high frequency transistor that does not include the fourth region 16 ("without Body contact") are compared.

As shown in FIG. 6, the breakdown voltage at turn-off in the high frequency transistor 2 is greater than the breakdown voltage of the high frequency transistor according to the comparative example. In other words, in the high frequency transistor 2, the breakdown voltage at turn-off can be increased by providing the fourth region 16.

Also, the area occupied by the high frequency transistor 2 on the first insulating film FI can be reduced by providing the fourth region 16 between the first insulating film FI and the first contact region 13s. In other words, the element size can be reduced compared to a configuration in which the second region 13 and the fourth region 16 are arranged along the upper surface TS of the semiconductor layer 10 (referring to FIGS. 1A and 1B).

Figure 7A:
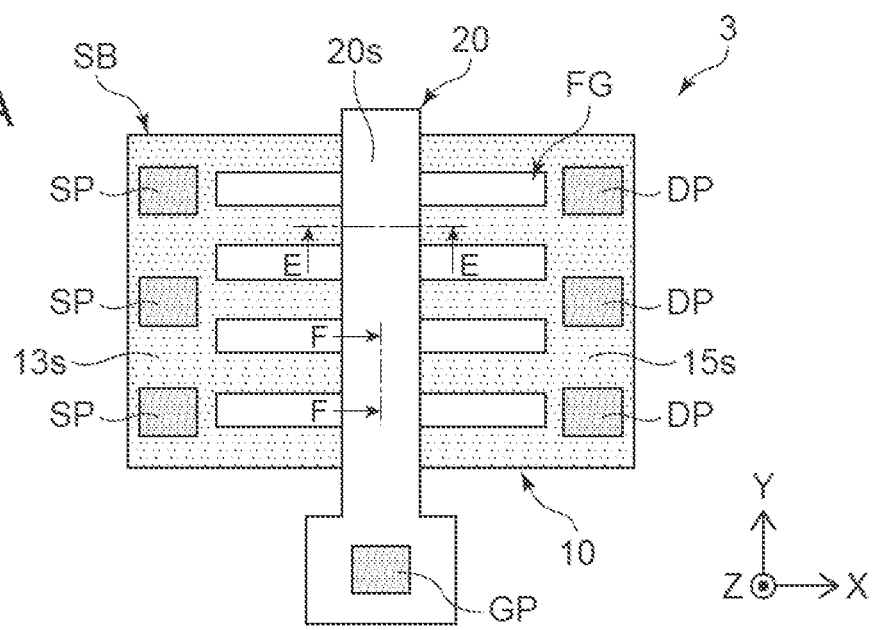
FIGS. 7A to 7C are schematic views showing a high frequency transistor according to a modification of the second embodiment.
Figure 7B:
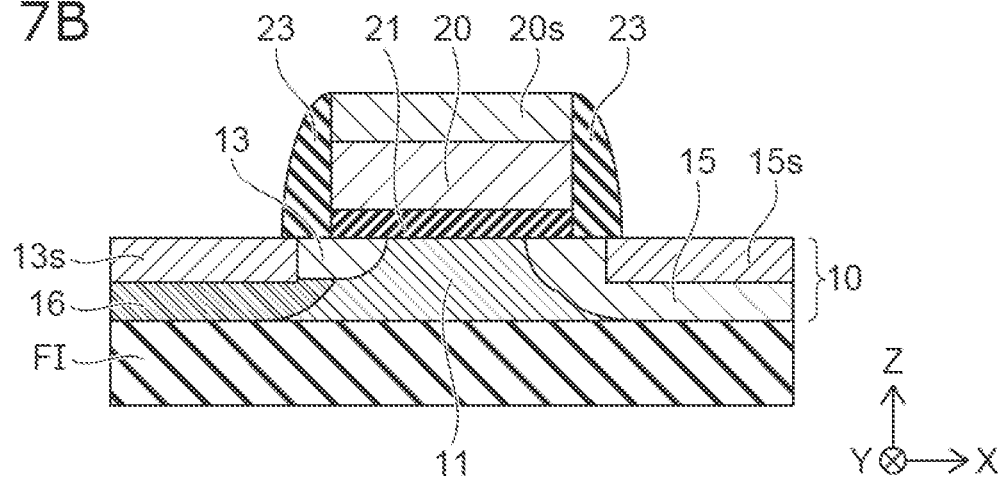
Figure 7C:
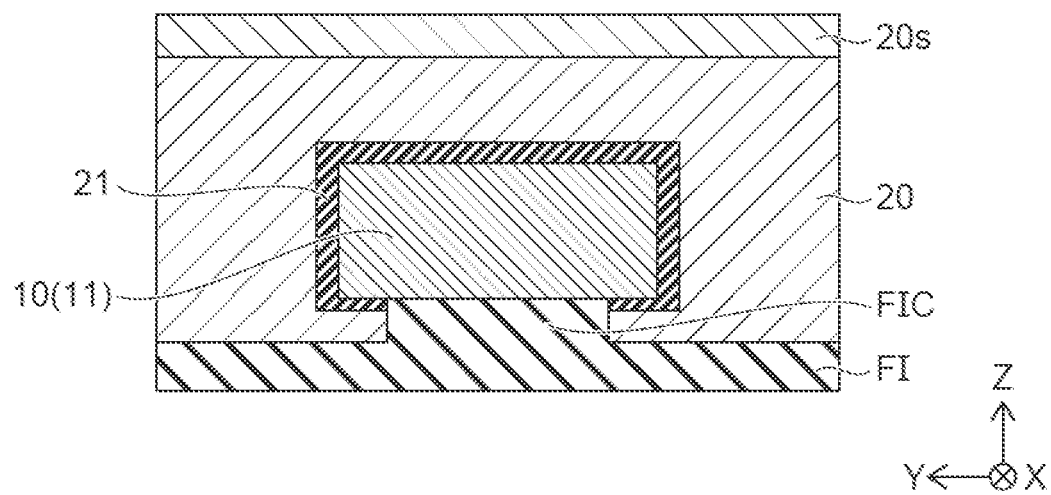

FIGS. 7A to 7C are schematic views showing a high frequency transistor 3 according to a modification of the second embodiment. FIG. 7B is a cross-sectional view along line E-E shown in FIG. 7A. FIG. 7C is a cross-sectional view along line F-F shown in FIG. 7A.

As shown in FIG. 7A, the high frequency transistor 3 includes the semiconductor part SB and the control electrode 20. The semiconductor part SB is provided on, for example, the first insulating film FI The semiconductor part SB includes the multiple semiconductor layers 10 that are subdivided by the trenches FG extending in, for example, the X-direction.

The multiple semiconductor layers 10 are arranged in the Y-direction. The control electrode 20 extends in the Y-direction and straddles the multiple semiconductor layers 10. The multiple semiconductor layers 10 are joined together at both ends in the X-direction and are connected to the contact plugs SP and DP.

As shown in FIG. 7B, the high frequency transistor 3 further includes the first insulating film FI, the second insulating film 21, and the sidewall 23. The third insulating film 30 (referring to FIG. 1A) is not illustrated in FIG. 7B.

The first insulating film FI is provided on, for example, the semiconductor substrate SS (referring to FIGS. 1A and 1B). The semiconductor layer 10 is provided on the first insulating film FI The second insulating film 21 is provided between the semiconductor layer 10 and the control electrode 20. The second insulating film 21 is electrically insulates the semiconductor layer 10 from the control electrode 20. The sidewall 23 is provided on the side surface of the control electrode 20.

The semiconductor layer 10 includes the first region 11, the second region 13, the third region 15, the fourth region 16, the first contact region 13s, and the second contact region 15s.

The first region 11 is provided between the first insulating film FI and the control electrode 20. Also, the first region 11 is provided between the second region 13 and the third region 15. The first region 11 includes a portion that is positioned between the second region 13 and the third region 15. The portion of the first region 11 faces the control electrode 20 via the second insulating film 21.

The first contact region 13s and the second region 13 are arranged along the upper surface TS of the semiconductor layer 10 (referring to FIGS. 1A and 1B). The second region 13 is provided between the first region 11 and the first contact region 13s. Also, the second region 13, for example, is provided between the first insulating film FI and the sidewall 23 (the source side). The first contact region 13s is in contact with the second region 13 and electrically connected thereto.

The fourth region 16 is provided between the first insulating film FI and the first contact region 13s. The fourth region 16 is linked to the first region 11. The fourth region 16 is electrically connected to the first region 11 between the first insulating film FI and the second region 13. Also, the fourth region 16 is in contact with the first contact region 13s and electrically connected thereto. The first region 11 is electrically connected to the first contact region 13s via the fourth region 16.

As shown in FIG. 7C, the semiconductor layer 10 has, for example, a rectangular shape at a cross section along the Y-Z plane. The control electrode 20 covers the upper surface TS and the side surface LS of the semiconductor layer 10 (referring to FIG. 1B) via the second insulating film 21. The control electrode 20 includes a portion that extends between the first insulating film FI and the semiconductor layer 10. The portion of the control electrode 20 faces a portion of the lower surface BS of the semiconductor layer 10 (referring to FIG. 1B) via the second insulating film 21. In other words, the control electrode 20 covers the four corners of the semiconductor layer 10 via the second insulating film 21.

Figure 8A:
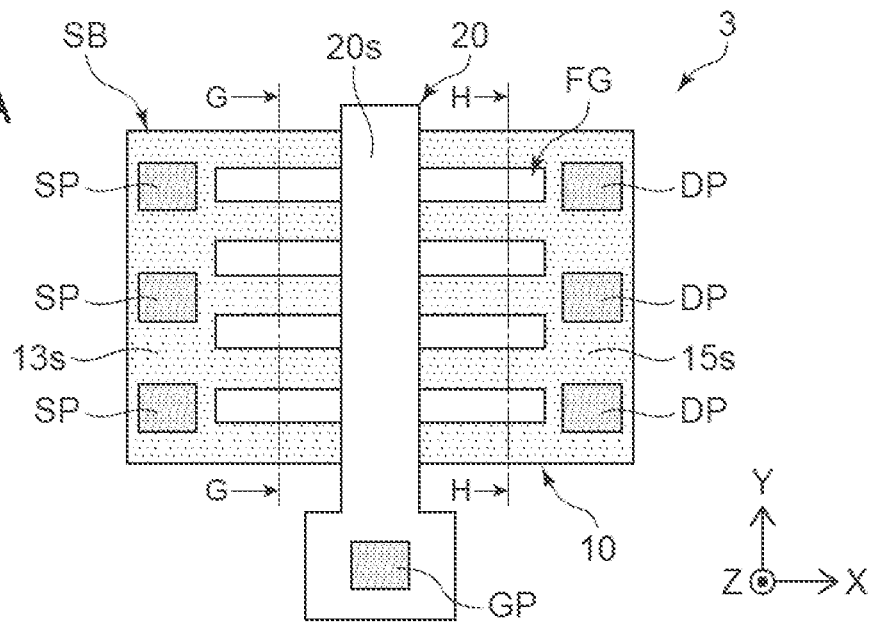
FIGS. 8A to 8C are other schematic views showing the high frequency transistor according to the second embodiment.
Figure 8B:
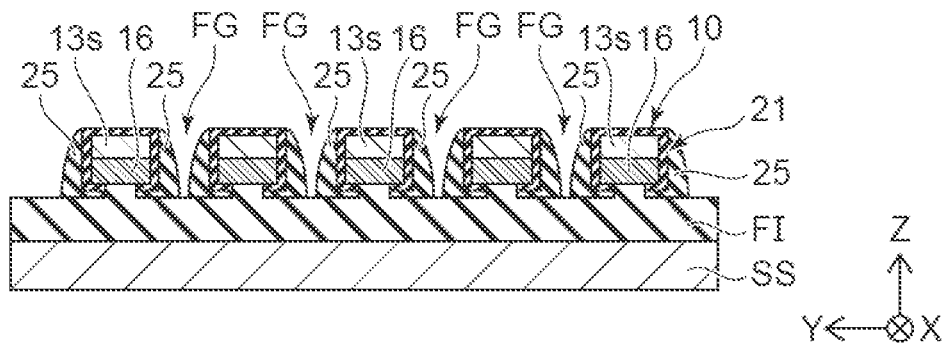
Figure 8C:
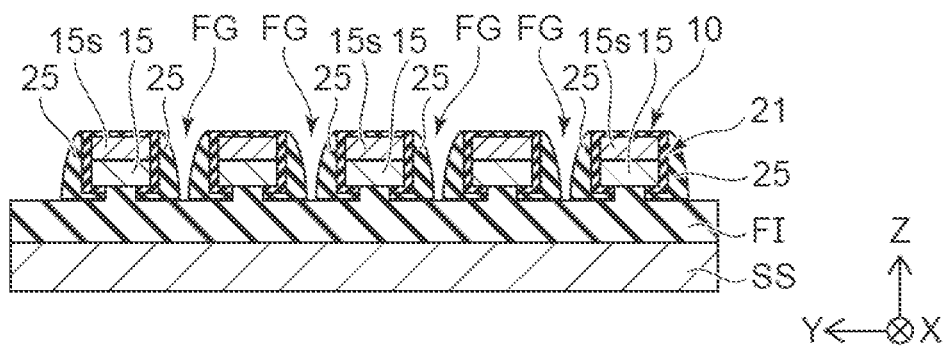

FIGS. 8A to 8C are other schematic views showing the high frequency transistor 3 according to the second embodiment. FIG. 8A is the same plan view as FIG. 7A. FIG. 8B is a cross-sectional view along line G-G shown in FIG. 8A. FIG. 8C is a cross-sectional view along line H-H shown in FIG. 8A.

As shown in FIG. 8B, the multiple semiconductor layers 10 are arranged in the Y-direction along the upper surface of the first insulating film FI. The sidewalls 25 are provided on the side surfaces of each semiconductor layer 10 inside the trenches FG. The fourth region of the semiconductor layer 10 is provided between the first insulating film FI and the first contact region 13s.

The first insulating film FI contacts the lower surface BS of the semiconductor layer 10 via the contact portion FIC. The sidewall 25 includes a portion that extends between the first insulating film FI and the lower surface BS of the semiconductor layer 10. The second insulating film 21 is also provided between the semiconductor layer 10 and the sidewall 25.

As shown in FIG. 8C, the sidewalls 25 are provided on the side surfaces of each semiconductor layer 10 inside the trenches FG at the drain side as well. The third region 15 of the semiconductor layer 10 is provided between the first insulating film FI and the second contact region 15s.

Figure 9:
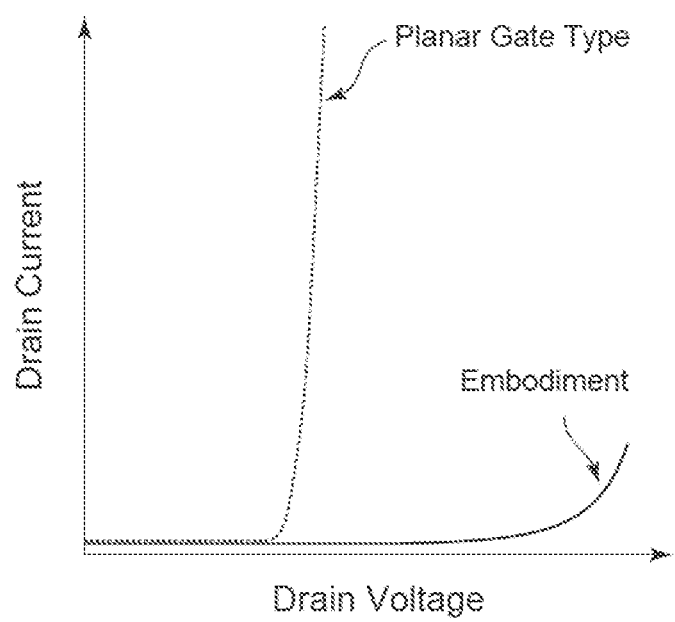
FIG. 9 is a graph showing characteristics of the high frequency transistor according to the modification of the second embodiment.

FIG. 9 is a graph showing characteristics of the high frequency transistor 3 according to the modification of the second embodiment. The horizontal axis is the drain voltage; and the vertical axis is the drain current at turn-off. In the example, compared are characteristics of the high frequency transistor 2 ("Embodiment") and a planar gate type high frequency transistor that has a planar gate structure (see FIGS. 5A and 5B).

As shown in FIG. 9, the breakdown voltage of the high frequency transistor 3 is greater than the breakdown voltage of the planar gate type transistor. Thus, the breakdown voltage at turn-off can be increased by using a structure in which the control electrode 20 covers the four corners of the semiconductor layer 10 in the Y-Z cross section.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A high frequency transistor, comprising:
a first insulating film;
a first semiconductor layer provided on the first insulating film, the first semiconductor layer extending in a first direction along an upper surface of the first insulating film, the first semiconductor layer having a first layer thickness in a second direction perpendicular to the upper surface of the first insulating film, the first semiconductor layer having a first width in a third direction along the upper surface of the first insulating film, the third direction being orthogonal to the first direction, the first width being greater than the first layer thickness;
a control electrode partially provided on the first semiconductor layer, the control electrode covering an upper surface of the first semiconductor layer and a side surface of the first semiconductor layer, the upper surface crossing the second direction, the side surface crossing the third direction; and
a second insulating film provided between the first semiconductor layer and the control electrode, the second insulating film electrically insulating the control electrode from the first semiconductor layer,
the first semiconductor layer including a first region of a first conductivity type, a second region of a second conductivity type, and a third region of the second conductivity type,
the first region, the second region, and the third region being arranged in the first direction, the first region being provided between the second region and the third region, the control electrode covering the first region.

2. The transistor according to claim 1, wherein
the first insulating film includes a protrusion contacting a lower surface of the first semiconductor layer, the lower surface of the first semiconductor layer being at a side opposite to the upper surface of the first semiconductor layer, the protrusion of the first insulating film including a second width in the third direction, the first width being greater than the second width, and
the control electrode includes a portion extending between the first insulating film and the first semiconductor layer, the control electrode facing a portion of the lower surface of the first semiconductor layer via the second insulating film.

3. The transistor according to claim 2, wherein
the protrusion of the first insulating film contacts a center of the lower surface of the first semiconductor layer in the third direction, and
the control electrode extends between the first insulating film and the first semiconductor layer at both sides of the protrusion in the third direction.

4. The transistor according to claim 3, wherein
the semiconductor layer has a rectangular cross-sectional shape at a cross section parallel to a plane including the second and third directions, and
the control electrode covers four corners of the cross-sectional shape.

5. The transistor according to claim 4, wherein the four corners are rounded in the cross-section.

6. The transistor according to claim 1, further comprising:
sidewalls provided on the first semiconductor layer, the sidewalls respectively contacting two side surfaces of the control electrode, the two side surfaces crossing the first direction,
the second region extends between the first insulating film and one of the sidewalls, the second region further extending between the control electrode and the first insulating film,
the third region including a portion that extends between the first insulating film and another sidewall, the portion of the third region further extending between the control electrode and the first insulating film.

7. The transistor according to claim 1, further comprising:
a first contact plug electrically connected to the second region of the first semiconductor layer,
the first semiconductor layer further including a first contact region and a fourth region of the first conductivity type, the first contact region being connected to the first contact plug, the fourth region being provided between the first insulating film and the first contact region,
the second region being provided between the first region and the first contact region, the second region being electrically connected to the first contact plug via the first contact region,
the fourth region being linked to the first region between the first insulating film and the second region, the first region being electrically connected to the first contact region via the fourth region.

8. The transistor according to claim 7, wherein
the first contact region includes a silicide.

9. The transistor according to claim 7, further comprising:
a second contact plug electrically connected to the third region of the first semiconductor layer,
the first semiconductor layer further including a second contact region provided between the third region and the second contact plug, the third region contacting the first insulating film between the first insulating film and the second contact region.

10. The transistor according to claim 9, wherein
the second contact region includes a silicide.

11. The transistor according to claim 1, further comprising:

a second semiconductor layer extending in the first direction, the first and second semiconductor layers being arranged in the third direction, the second semiconductor layer being partially covered with the control electrode extending in the third direction; and another second insulating film provided between the second semiconductor layer and the control electrode, said another second insulating film electrically insulating the second semiconductor layer from the control electrode.

12. A high frequency transistor, comprising:

a first insulating film;

a first semiconductor layer provided on the first insulating film, the first semiconductor layer including a first region of a first conductivity type, a second region of a second conductivity type, a third region of the second conductivity type, a first contact region linked to the second region, a second contact region linked to the third region, and a fourth region of the first conductivity type;

a control electrode partially provided on the first semiconductor layer; and a second insulating film provided between the first semiconductor layer and the control electrode, the second insulating film electrically insulating the control electrode from the first semiconductor layer, the first to third regions of the first semiconductor layer being arranged in a first direction along an upper surface of the first insulating film, the first region being provided between the second and third regions in the first direction, the first region being provided between the first insulating film and the control electrode in a second direction perpendicular to the upper surface of the first insulating film, the second region being provided between the first contact region and the first region in the first direction, the third region including a portion that is provided between the first region and the second contact region in the first direction, the third region including another portion provided between the first insulating film and the second contact region in the second direction, the fourth region being provided between the first insulating film and the first contact region, the fourth region being linked to the first region between the first insulating film and the second region.

13. The transistor according to claim 12, further comprising:

sidewalls provided on the first semiconductor layer, the sidewalls respectively contacting two side surfaces of the control electrode, the two side surfaces crossing the first direction, the second region of the first semiconductor layer extends between the first insulating film and one of the sidewalls, the one of the side walls contacting one of the two side surfaces of the control electrode, the second region further extending between the control electrode and the first insulating film, the third region of the first semiconductor layer including a portion that extends between the first insulating film and another sidewall, said another side wall contacting the other of the two side surfaces, said another side wall extending between the control electrode and the first insulating film.

14. The transistor according to claim 12, wherein the third region of the first semiconductor layer contacts the first insulating film between the first insulating film and the second contact region of the first semiconductor layer.

15. The transistor according to claim 13, wherein the fourth region is linked to the first region between the first insulating film and the one of the sidewalls contacting the one of the two side surfaces.

* * * * *